United States Patent [19]

Keen

[11] Patent Number: 4,710,852

[45] Date of Patent: Dec. 1, 1987

[54] SPRING RETAINER FOR ENCAPSULATED SEMICONDUCTOR DEVICE

[75] Inventor: Nickey D. Keen, Kokomo, Ind.

[73] Assignee: General Motors Corporation, Detroit, Mich.

[21] Appl. No.: 911,736

[22] Filed: Sep. 26, 1986

[51] Int. Cl.⁴ .............................................. H05K 7/20
[52] U.S. Cl. ..................................... 361/386; 24/295; 24/458; 165/80.3; 174/16 HS; 357/81
[58] Field of Search ............... 361/386, 388, 389, 387, 361/417, 418, 419, 420; 174/16 HS; 165/80.2, 80.3, 185; 357/81; 24/625, 295, 573, 458

[56] References Cited

U.S. PATENT DOCUMENTS

| | | | |
|---|---|---|---|
| 2,917,286 | 12/1957 | Deakin | 257/263 |
| 3,154,281 | 10/1964 | Frank | 24/625 X |
| 3,259,813 | 4/1962 | Lindstrant | 317/234 |
| 3,777,052 | 12/1973 | Fegen | 174/138 |
| 3,849,838 | 11/1974 | Hehl | 361/417 X |
| 3,909,883 | 10/1975 | Fegen | 24/73 |
| B13,909,883 | 10/1982 | Fegen | 174/138 |
| 4,110,549 | 8/1978 | Goetzke et al. | 174/16 |
| 4,509,839 | 4/1985 | Lavochkin | 357/81 |

FOREIGN PATENT DOCUMENTS 568560 1/1959 Canada .................................. 24/295

OTHER PUBLICATIONS

"Surface-Mounted Power Transistor and Heatsink", IBM Tech. Disclosure Bulletin, vol. 28, No. 12, 5/86, pp. 5502-5503.

Primary Examiner—A. D. Pellinen
Assistant Examiner—Morris Ginsburg
Attorney, Agent, or Firm—Robert J. Wallace

[57] ABSTRACT

A spring steel bayonet type retainer for securing encapsulated semiconductor devices to circuit boards either directly or through an intermediate heat dissipator. The retainer comprises a spring steel body bent approximately centrally and at approximately right angles. At least one portion is slotted to define outboard spring fingers and inboard bayonet type arms which extend through aligned holes in the device and the circuit board. The noncoplanar portions provide clamping forces on the main body of the encapsulated semiconductor device and may be provided with laterally outwardly extending ears to fit closely within the confines of a heat dissipator device to prevent relative rotation therebetween.

9 Claims, 8 Drawing Figures

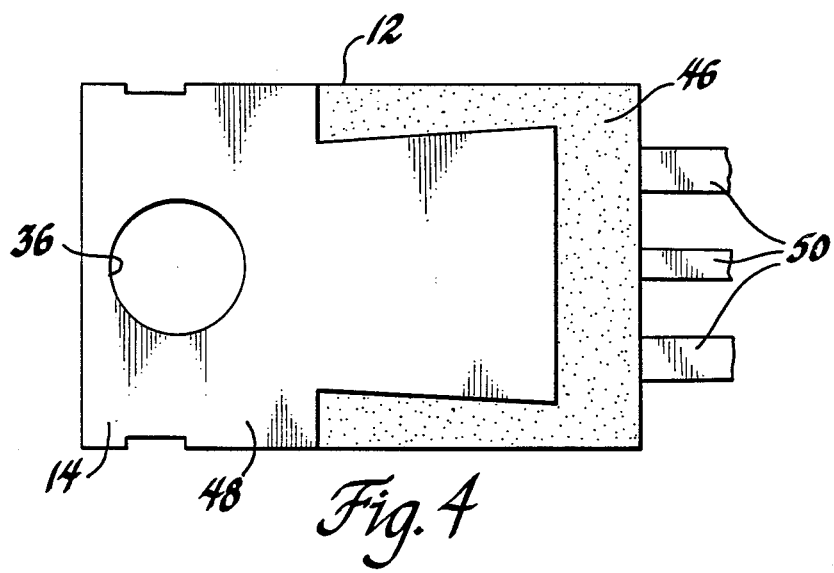
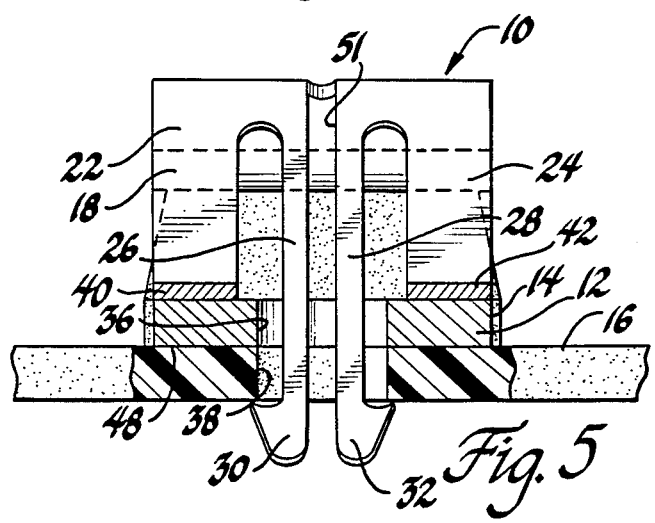
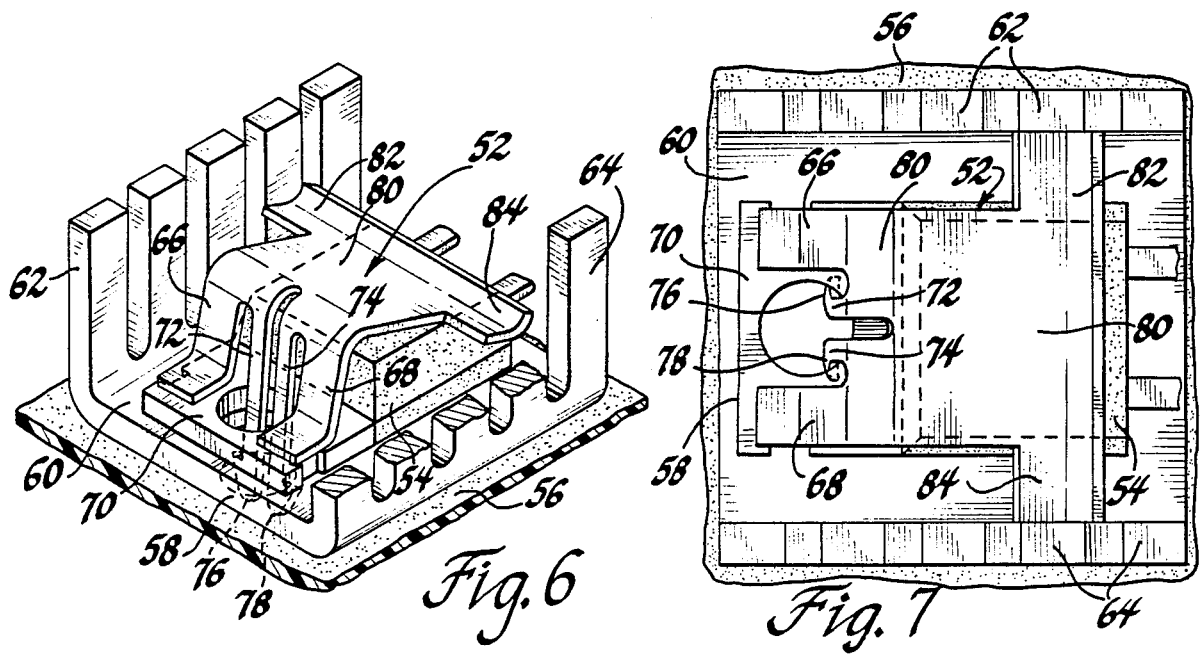

SPRING RETAINER FOR ENCAPSULATED SEMICONDUCTOR DEVICE

INTRODUCTION

This invention is in the field of non-threaded fasteners for securing encapsulated semiconductor devices such as transistors and diodes to circuit boards, either with or without intermediate heat dissipator components. More particularly the invention relates to a spring retainer which is easily installed and, if desired, easily removed and reused.

BACKGROUND OF THE INVENTION

A common form of encapsulated semiconductor device comprises a boxlike body portion having a short mounting tab of plated copper or the like, the mounting tab being integrated with the encapsulated boxlike body portion so as to present a flat surface which is placed on and against the circuit board or the intermediate heat dissipator when the device is installed. Typically there is a hole formed in the mounting tab to receive a fastener or retainer such as a small threaded bolt which is used in combination with a threaded nut to secure the device to the circuit board. Other types of fasteners including screws and rivets can also be used.

The fastener devices mentioned above have at least two drawbacks: the first is the fact that the securing force is concentrated in the area of the mounting tab and this can cause the device to lift away from the mounting board in the area of the boxlike encapsulation structure. This greatly reduces heat transfer from the semiconductor to the circuit board or to the intermediate heat dissipation. The second disadvantage is the fact that such fasteners are cumbersome to install and/or remove.

The prior art shows various types of spring clip devices for securing semiconductors and the like in place. Deakin U.S. Pat. No. 2,917,286, for example, shows a spring clip comprising a central collar portion and outboard barbs which extend through two widely spaced holes in the circuit board or the like. Lackey U.S. Pat. No. 2,994,203 discloses a clip having a cylindrical case. Lindstrand U.S. Pat. No. 3,259,813 shows a clip for holding a device to a heat sink. Lavochkin U.S. Pat. No. 4,509,839 makes a similar disclosure of a clip for holding a transistor to a heat dissipator of the type having a flat central body portion and opposite upstanding wings or fins.

SUMMARY OF THE INVENTION

The present invention is an easily installed and easily removed clip type retainer for securing encapsulated semiconductor devices and the like to circuit boards either with or without an intermediate heat dissipator component. The invention obviates the need for threaded fasteners, rivets and the like and provides a balanced, distributed clamping force which holds the encapsulated semiconductor device flat against the face of the circuit board to which it is to be installed.

In general the invention comprises a retainer formed from an integral body of flat spring metal or metal-like stock bent approximately centrally to form noncoplanar first and second portions which are joined at a fold line. At least the first portion is slotted to define outboard spring fingers and inboard bayonet arms, the bayonet arms being bent into a plane between the planes of the first and second portions. The retainer is installed by urging the bayonet arms through a hole in the mounting tab of the semiconductor device and through the circuit board where barbs on the terminal ends of the bayonet arms lock the arms into the hole. The length of the arm is such as to cause the body portion to flex slightly toward the unfolded condition whereby both the first and second portions compliantly exert substantially spaced downward forces on the exposed surface or surfaces of the semiconductor device to hold it to the circuit board either directly or indirectly through an intermediate heat dissipator.

In a modified form of the inventive device adapted specifically for use in combination with heat dissipators of the U-shaped type, the clamping portion of the retainer body has outwardly extending ears which fit closely between the opposite fins or wall portions of the heat dissipator to prevent relative rotation between the semiconductor device, the retainer and the heat dissipator.

BRIEF DESCRIPTION OF THE DRAWING

FIG. 4 is a bottom plan view of the encapsulated transistor 12 of FIGS. 1-3;

FIG. 5 is a front view partly in section of the installed retainer device in the combination of FIGS. 1 and 2;

FIG. 6 is a perspective view of a second embodiment of the retainer device for use in combination of an intermediate heat dissipator;

FIG. 7 is a top view of the installation of FIG. 6;

DETAILED DESCRIPTION OF THE ILLUSTRATIVE EMBODIMENTS

Figure 1:
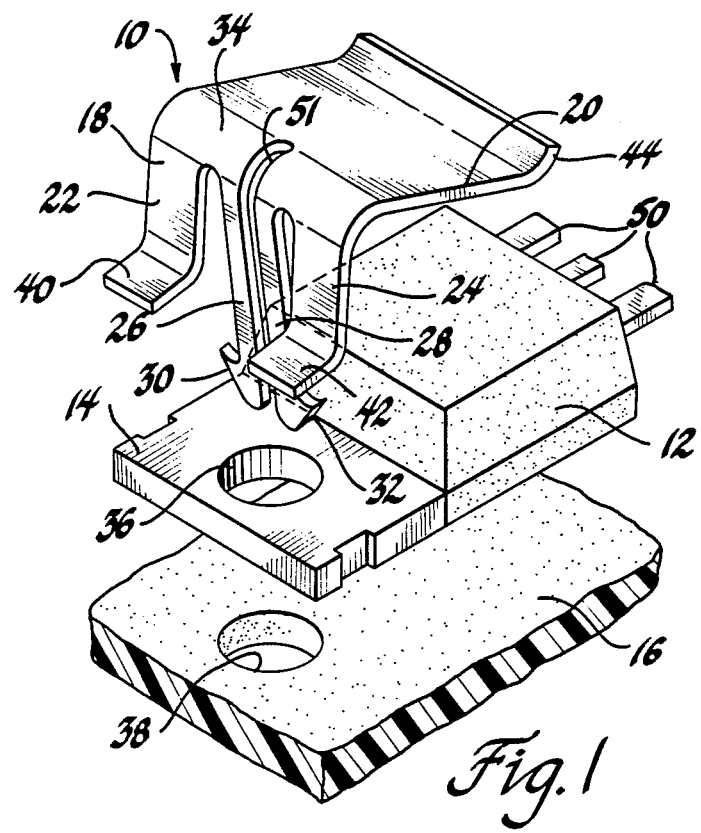
FIG. 1 is an exploded perspective view of a first embodiment of the invention for securing an encapsulated transistor to a circuit board.

Referring first to FIGS. 1-5 the first illustrative embodiment of the invention takes the form of a retainer 10 adapted to hold an encapsulated transistor 12 having a mounting tab 14 to a circuit board 16. The retainer 10 comprises a body of flat spring steel and is bent approximately centrally to form noncoplanar securement portion 18 and clamping portion 20. In the unflexed configuration the portions 18 and 20 occupy planes which lie approximately at right angles from one another, the precise angle being adjustable to suit the particular application. Although steel is the preferred material from which to construct the retainer 10, other materials having metal like qualities; i.e., springlike resilience, may also be employed.

Looking specifically to securement portion 18 of retainer 10, this portion is divided up into outboard spring fingers 22 and 24 and inboard bayonet type arms 26 and 28 which terminate in outwardly extending barbs 30 and 32. All of the elements 22, 24, 26 and 28 are defined by parallel slots formed in the securement portion 18, the central slot between arms 26 and 28 extending fully into and preferably just beyond the fold line 34.

Figure 2:
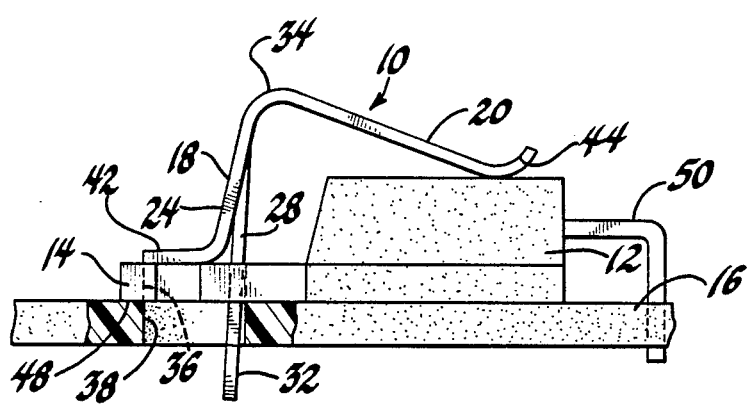
FIG. 2 is a side view of the apparatus of FIG. 1 in the installed condition.

As shown in FIGS. 2 and 5 the arms 26 and 28 are effectively longer than the outboard spring fingers 22 and 24 and lie in a plane between portions 18 and 20 such that the retainer 10 may be installed by urging the arms 26 and 28 through a hole 36 in the mounting tab 14 of the device 12 and through a hole 38 in the circuit board 16 to flex the device slightly and exert downward clamping force on the device 12 to hold it flat and firm against the circuit board 16.

To this end the terminal ends of the spring fingers 22 and 24 are preferably reversely bent at 40 and 42 to provide seating areas which bear against the top or exposed surface of the mounting tab 14 when the device is in the installed configuration. Likewise the terminal edge 44 of the clamping portion 20 is reversely bent to provide a seating area which lies atop the exposed surface of the encapsulated body portion 12 of the transistor.

Figure 3:
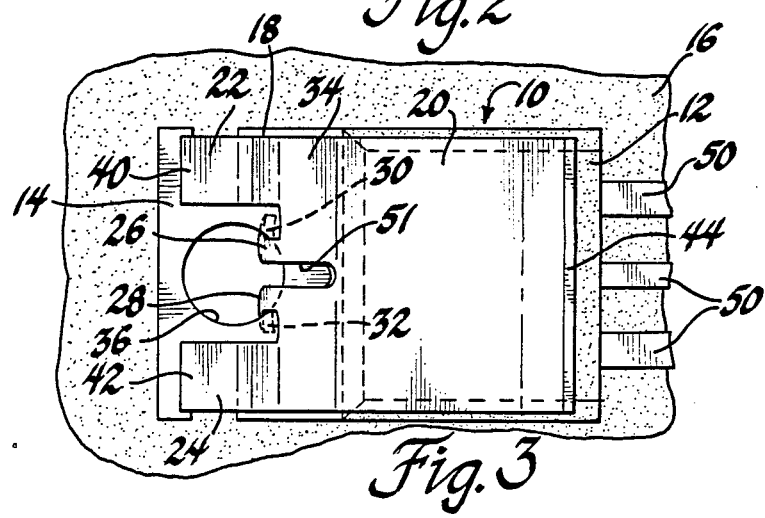
FIG. 3 is a top plan view of the assembly of FIG. 1.

FIG. 3 shows how the central slot 51 extends into the fold line 34 so as to give the bayonet type arms 26 and 28 lateral flexibility so that they may flex toward one another as the rounded cam surface edges of the barbs 30 and 32 are forced through the holes 36 and 38 in the mounting tab 14 and circuit board 16 respectively. Once the barbs 30 and 32 are through the hole 38 in the circuit board 16, the arms 26 and 28 flex outwardly such that the barbs 30 and 32 lock under the surface of the circuit board 16 as shown in FIG. 5 holding the retainer 10 in place atop the semiconductor device 12 and holding the combination firmly against the surface of the circuit board 16.

FIG. 4 illustrates the bottom surface of the transistor device 12. The device comprises a surface 46 of the encapsulation area or box and a plated copper metal heat transfer surface 48 which fully surrounds the hole 36 and extends from the encapsulation box to the bottom surface of the mounting tab 14. Electrical terminals 50 extend from one end surface of the encapsulation box.

Figure 8:
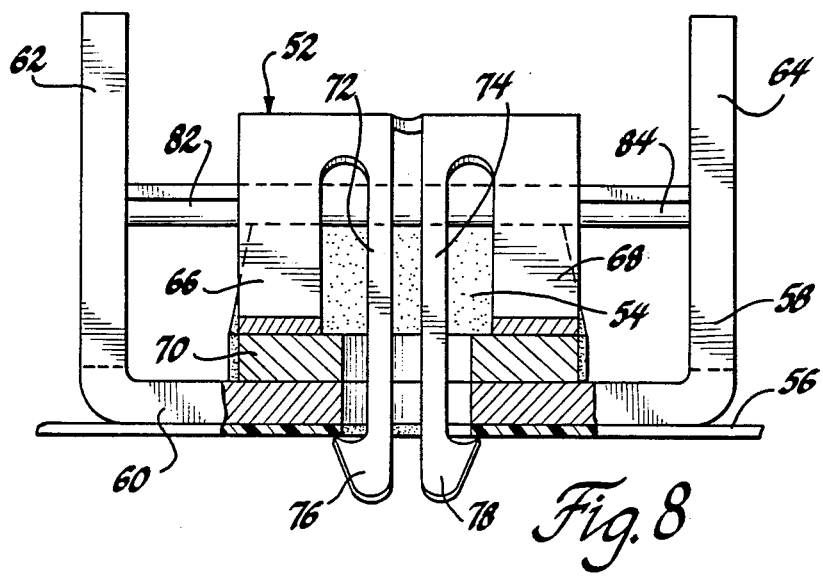
FIG. 8 is a front view partly in section of the combination of the retainer, the semiconductor device, the heat dissipator and the circuit board in the combination of FIGS. 6 and 7.

Looking now to FIGS. 6–8 a second embodiment of the invention is shown in a combination which comprises a spring steel retainer 52, an encapsulated semiconductor device 54, a circuit board 56 and an intermediate heat dissipator component 58 the function of which is to substantially increase the transfer of heat from the device 54 to the surrounding air. The heat dissipator component 58 comprises a flat central body portion 60 which is intended to lie firmly and abuttingly against the exposed surface of the circuit board 56, and opposite finlike wall structures 62 and 64 which extend upwardly from the circuit board 56 in parallel relationship with one another.

Describing the retainer device 52 in greater detail, it is similar to the retainer 10 of FIGS. 1–5 in that it being preferably fabricated of flat spring steel stock bent approximately centrally into noncoplanar portions, the securement portion being slotted as before to define outboard spring fingers 66 and 68 which are adapted to bear firmly upon the top surface of the mounting tab 70 of the encapsulated semiconductor device 54. Similarly the slots in the securement portion of the retainer 52 define bayonet type arms 72 and 74 terminating in cam like barbs 76 and 78 which can flex inwardly relative to one another as they are urged through the aligned holes in the mounting tab 70, the central body portion 60 of the heat dissipator component 58 and the circuit board 56 as shown best in FIG. 8. Because the overall width of the arms 72 and 74 in the areas of the barbs 76 and 78, like the embodiment of FIGS. 1–5, is greater than the diameter of the holes through which the bayonet type arms are urged, the barbs spring back out and prevent removal of the retainer 52 from the combination to which it is applied.

The principal difference between the retainer 52 of FIGS. 6–8 and retainer 10 of FIGS. 1–5 lies in the construction of the clamping portion 80. This portion is formed with laterally opposite outwardly extending wings or ears 82 and 84 which fit closely within the wall portions 62 and 64 of the heat dissipator component 58 as best shown in FIGS. 6 and 7 to prevent relative rotation between the retainer 52 and the heat dissipator component 58.

Note that the retainer 52 of FIGS. 6–8, like the retainer 10 in FIGS. 1–5, has a central slot which extends upwardly into and through the fold line to increase the lateral flexibility of the bayonet type arms 72 and 74 which extend through the aligned holes in the components to be joined. Again the terminal ends of the spring fingers 66 and 68 as well as the terminal edge of the clamping portion 80 are preferably reversely bent to provide smooth seating areas which bear against the top or exposed surfaces of the encapsulated semiconductor device 54.

Although the semiconductor device 54 as shown in the two embodiments exhibit noncoplanar top surfaces the retainer of the subject invention is not restricted to use with such noncoplanar top surfaces and may easily be reconfigured to accommodate planar top surfaces as will be apparent to skilled artisans.

The embodiments of the invention in which an exclusive property or privilege is claimed are defined as follows:

1. An easily installed, pressure distributing retainer for clamping a device having an aperture therein to a plate-like member having an aperture therein, said retainer comprising:
    a body of flat spring stock bent approximately centrally along a transverse fold line to define integral first and second noncoplanar portions having an acute angle therebetween;
    first and second bayonet arms formed out of said first noncoplanar portion and extending substantially coplanarly within the acute angle between said noncoplanar portions;
    each of said bayonet arms terminating in a transversely operative barb portion;
    said bayonet arms being mutually transversely compliant to permit said bayonet arms to be flexed transversely as they are urged through an aperture;
    at least one clamping arm formed out of said first noncoplanar portion,
    said clamping arm being shorter than said bayonet arms and having an end adapted for applying a clamping force towards a surface,
    effective to allow said second noncoplanar portion to also apply a clamping force towards said surface.

2. The retainer defined by claim 1 wherein the first and second bayonet arms are formed approximately centrally out of said first noncoplanar portion and are spaced by a longitudinal opening in said first noncoplanar portion;
    two clamping arms are also formed out of said first noncoplanar portion;
    said clamping arms are laterally spaced on said first portion, with said bayonet arms between;
    ends on each of said clamping arms bent to provide a clamping face generally orthogonal to said bayonet arms and parallel to a surface having the aperture through which said bayonet arms are urged.

3. The retainer of claim 2 wherein said longitudinal opening in said first noncoplanar portion of said body also extends through said fold line into said second noncoplanar portion, effective to add lateral compliance to said bayonet arms.

4. An easily installed retainer for securing an encapsulated semiconductor device to a circuit board comprising:

an integral body of flat spring metal stock having opposite ends and transversely bent at an acute angle to form securement and clamp portions joined at a fold line;

the securement portion comprising outboard spring fingers and inboard bayonet arms, said fingers and arms being mutually defined by parallel longitudinal slots extending from the securement portion end of said body substantially to said fold line, said bayonet arms having outwardly extending barbed end portions;

said arms of said securement portion of said body forming an acute angle with said clamp portion that is not greater than the acute angle the balance of said securement portion makes with said clamp portion;

said bayonet arms having a longitudinal length greater than said spring fingers to extend through registered apertures in said device and in said board and, by way of said barbed end portions, resist removal from said board, the length of said bayonet arms in comparison to the length of the fingers being such as to cause the securement and clamp portions, while bearing against top surfaces of said device, to flex resiliently toward the unfolded condition to hold said device to said circuit board.

5. The retainer as defined in claim 4 wherein the ends of said barbed end portions are curved in a cam configuration to facilitate insertion of said arms into and through an aperture in said device.

6. The retainer as defined in claim 4 wherein one of the slots between said bayonet arms and fingers is a slot between the bayonet arms and said slot extends into the fold line.

7. The retainer as defined in claim 4 wherein terminal ends of said spring fingers and a terminal end of said clamp portion are reversely bent to form seat areas.

8. The retainer as defined in claim 4 for use with a heat dissipater having a planar body portion disposed between said device and said circuit board, said bayonet arms being sufficiently long to extend through said device, said heat dissipater body portion and said circuit board.

9. The retainer as defined in claim 8 wherein said retainer further includes oppositely laterally outwardly extending ears formed on said clamp portion, so that with a heat dissipater including opposite parallel and upwardly extending wall portions integral with but at substantially right angles to said planar body portion, the outward ears of said clamp portion being of such total lateral dimension as to fit snugly within the opposite wall portions of said dissipater to prevent relative rotation between said dissipater and said retainer.

* * * * *